United States Patent
Dellea et al.

(10) Patent No.: US 9,873,227 B2
(45) Date of Patent: *Jan. 23, 2018

(54) METHOD FOR TRANSFERRING OBJECTS ONTO A SUBSTRATE USING A COMPACT PARTICLE FILM, INCLUDING A STEP OF PRODUCING CONNECTORS ON THE OBJECTS

(71) Applicant: COMMISSARIAT A L'ENERGIE ATOMIQUE ET AUX ENERGIES ALTERNATIVES, Paris (FR)

(72) Inventors: Olivier Dellea, La Talaudiere (FR); Philippe Coronel, Barraux (FR); Nicolas Dreuilles, Grenoble (FR); Pascal Fugier, Bernin (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 659 days.

This patent is subject to a terminal disclaimer.

(21) Appl. No.: 14/375,858

(22) PCT Filed: Feb. 8, 2013

(86) PCT No.: PCT/EP2013/052500
§ 371 (c)(1),
(2) Date: Jul. 31, 2014

(87) PCT Pub. No.: WO2013/117678
PCT Pub. Date: Aug. 15, 2013

(65) Prior Publication Data
US 2014/0374930 A1    Dec. 25, 2014

(30) Foreign Application Priority Data
Feb. 10, 2012 (FR) ..................... 12 51257

(51) Int. Cl.
*B29C 65/70* (2006.01)
*G02B 6/26* (2006.01)
(Continued)

(52) U.S. Cl.
CPC ............... *B29C 65/70* (2013.01); *B05C 3/00* (2013.01); *B05C 3/18* (2013.01); *B05D 1/20* (2013.01);
(Continued)

(58) Field of Classification Search
CPC ................ B29C 65/70; H01L 24/89; H01L 2924/12044; H01R 43/007; G02B 6/26;
(Continued)

(56) References Cited

U.S. PATENT DOCUMENTS 4,888,209 A  12/1989  Neely
7,241,341 B2 *  7/2007  Picard .................. B01D 69/122
                                                118/264
(Continued)

FOREIGN PATENT DOCUMENTS

CA    2 695 449 A1    2/2008
WO    01 89716       11/2001
WO    03 095108      11/2003

OTHER PUBLICATIONS

U.S. Appl. No. 13/642,997, filed Oct. 23, 2012, Phan, et al.
(Continued)

*Primary Examiner* — Robert J Grun
(74) *Attorney, Agent, or Firm* — Oblon, McClelland, Maier & Neustadt, L.L.P.

(57) ABSTRACT

A method for transferring objects onto a substrate, or running substrate, the objects to be transferred being placed in a transfer area containing a carrier liquid forming a conveyor, the objects being held by a compact film of particles floating on the carrier liquid of the transfer area, within
(Continued)

which the objects are displaced with the film of particles to be transferred onto the substrate, making at least one connector on at least one of the objects, the connector being made by a substance comprising a polymerizable compound, put in contact with the object arranged within the transfer area, and then by polymerization of the substance.

16 Claims, 10 Drawing Sheets

(51) Int. Cl.
| | |
|---|---|
| *H01L 23/00* | (2006.01) |
| *H01R 43/00* | (2006.01) |
| *B05D 1/20* | (2006.01) |
| *B05C 3/00* | (2006.01) |
| *B05C 3/18* | (2006.01) |
| *B05C 5/02* | (2006.01) |
| *B82Y 30/00* | (2011.01) |
| *B29K 509/08* | (2006.01) |
| *B29L 11/00* | (2006.01) |
| *B29L 31/36* | (2006.01) |
| *B29L 31/00* | (2006.01) |

(52) U.S. Cl.
CPC ............... *G02B 6/26* (2013.01); *H01L 24/89* (2013.01); *H01R 43/007* (2013.01); *B05C 5/02* (2013.01); *B05D 2252/02* (2013.01); *B05D 2401/32* (2013.01); *B29K 2509/08* (2013.01); *B29K 2995/0093* (2013.01); *B29L 2011/0075* (2013.01); *B29L 2031/36* (2013.01); *B29L 2031/7278* (2013.01); *B29L 2031/779* (2013.01); *B82Y 30/00* (2013.01); *H01L 2924/12044* (2013.01)

(58) Field of Classification Search
CPC .... B05C 3/00; B05C 3/18; B05C 5/02; B05D 1/20; B05D 2401/32; B05D 2252/02; B29L 2031/7278; B29L 2031/779; B29L 2011/0075; B29L 2031/36; B29L 2509/08; B29K 2509/08; B29K 2995/0093; B82Y 30/00
See application file for complete search history.

(56) References Cited

U.S. PATENT DOCUMENTS

| | | |
|---|---|---|
| 7,591,905 B2 * | 9/2009 | Picard .................. B01D 69/122 118/404 |
| 7,804,134 B2 | 9/2010 | Coronel et al. |
| 2005/0281944 A1 | 12/2005 | Jang |
| 2013/0052552 A1 | 2/2013 | Phan et al. |
| 2013/0330471 A1 | 12/2013 | Dellea et al. |
| 2014/0147583 A1 | 5/2014 | Dellea et al. |
| 2014/0158334 A1 | 6/2014 | Dellea et al. |

OTHER PUBLICATIONS

U.S. Appl. No. 14/001,088, filed Aug. 22, 2013, Dellea, et al.
U.S. Appl. No. 14/128,266, filed Feb. 25, 2014, Dellea, et al.
U.S. Appl. No. 14/131,082, filed Jan. 6, 2014, Dellea, et al.
U.S. Appl. No. 14/232,092, filed Jan. 10, 2014, Savelli, et al.
U.S. Appl. No. 14/369,752, filed Jun. 30, 2014, Dellea, et al.
U.S. Appl. No. 14/375,994, filed Jul. 31, 2014, Dellea, et al.
U.S. Appl. No. 14/375,532, filed Jul. 30, 2014, Dellea, et al.
International Search Report dated May 28, 2013 in PCT/EP13/052500 filed Feb. 8, 2013.
U.S. Appl. No. 14/398,340, filed Oct. 31, 2014, Savelli, et al.
U.S. Appl. No. 14/423,957, filed Feb. 25, 2015, Dellea, et al.

* cited by examiner

METHOD FOR TRANSFERRING OBJECTS ONTO A SUBSTRATE USING A COMPACT PARTICLE FILM, INCLUDING A STEP OF PRODUCING CONNECTORS ON THE OBJECTS

TECHNICAL FIELD

The invention relates to the field of transferring objects to a substrate, preferably a running substrate, to manufacture various devices.

In particular this relates to manufacturing devices of hybrid character, such as sensors for example. By way of indication, a hybrid device by definition associates objects on the same substrate having diverse functions, for example electronic, optical, electro-optical, piezoelectric, thermo-electrical, mechanical, etc.

The objects to be deposited/transferred are for example:
 active electronic components, such as transistors, microprocessors, integrated circuits, etc.;
 passive electronics components, such as resistors, capacitors, diodes, photodiodes, coils, tracks conductors, welding preforms, etc.;
 optical components, such as lenses, microlenses, diffraction gratings, filters, etc.;
 battery cells, micro-battery cells, micro-battery cells, photo-detectors, solar cells, RFID systems, etc.;
 nano- or micro-metric particles or aggregates, active or passive, for example of type of oxides, polymers, metals, semiconductors, Janus (particles having two faces of different natures or properties), nanotubes, etc.

More particularly, the invention relates to the transfer of objects whereof the dimensions extend:
 for components: from the microscopic scale (a few tens of microns), to the macroscopic scale (more than about ten centimetres); and
 for particles and aggregates: from one nanometre to several hundreds of microns.

The invention also relates to the field of electronics, according to two-dimensional and three-dimensional architectures.

STATE OF THE PRIOR ART

For manufacturing such devices, a technique for transfer of objects to a substrate via a liquid conveyor has been developed recently. However, these devices generally need the presence of connectors, whether electric, thermal, optical, or mechanical. These connectors connect two objects of the device, and/or serve as a link intended to cooperate with an element external to the device.

However, standard techniques for making such connectors (brazing, welding by bead bonding, wedge welding, etc.) do not prove to be adapted when it concerns transferring objects to a substrate by means of a liquid conveyor.

SUMMARY OF THE INVENTION

The aim of the invention therefore is to rectify at least partially the drawback mentioned hereinabove. To achieve this, the aim of the invention is a method for transferring objects onto a substrate, preferably running, executed by means of a transfer area containing a carrier liquid forming a conveyor, said objects being held by a compact film of particles floating on the carrier liquid of this transfer area, within which said objects are displaced with said film of particles so as to be transferred onto the substrate when they reach the outlet.

Also, the method comprises making at least one connector in contact with at least one of said objects, said connector being made by means of a substance comprising a polymerisable compound, placed in contact with said object arranged within the transfer area, then by polymerization of said substance.

This manufacturing technique of connectors proves simple to execute, and well adapted to the context of transfer of objects by liquid conveyor. In particular, during its application, any polymerisable substance is capable of adapting to any differences in level between the different connected objects and/or between the objects and the film of particles.

Contact of the connector with an object may be for example above or below this object, as will be explained hereinbelow.

Also, the connector(s) made may be connectors electric, thermal, optical, piezoelectric or mechanical, connecting two or more objects, or else intended to cooperate with an element external to the manufactured device. When they connect two or more objects, the latter are for example positioned in the plane of the film of particles.

Polymerization is completed by any technique deemed appropriate by one skilled in the art, preferably thermal or optical. It is complete or partial when the object is still on the carrier liquid, or alternatively is done entirely outside the carrier liquid, after transfer onto the substrate. Preferably, at the time of transfer onto the substrate, the substance, polymerised or not, remains sufficiently supple so as to support any flexion during passage from the transfer area onto the substrate.

As a function of needs and the nature of the connectors, the latter may be made by cords, continuous or discontinuous, or points, the diameter of the cords and points being close to a few tens of microns to several millimetres.

According to a preferred embodiment, at least one connector is made between at least two of said objects, by means of said substance comprising a polymerisable compound, applied to the film of particles so as to connect the two objects spaced apart from each other within the transfer area, then by polymerization of said substance. In this embodiment, the connector may connect any surfaces of the two objects, the latter being held by the film in the transfer area according to different forms which will be described hereinbelow.

According to another preferred embodiment, at least one connector is made between at least two of said objects intended to be stacked on each other, by means of said substance comprising a polymerisable compound applied to one of said objects arranged within the transfer area, then by polymerization of said substance. This technique is particularly interesting within the scope of manufacturing devices in three dimensions from several objects stacked and connected to each other.

In another preferred embodiment, the connector is provided to be in contact with an element external to the device, and therefore does not connect two objects placed in the transfer area as for the preceding embodiments. In this respect, it is noted that all the embodiments presented may be combined, specifically the same object placed in the transfer area may be equipped with different sorts of connectors.

In a particular case of the last embodiment described, said substrate is devoid of at least one through-hole, intended to house at least one connector made between the lower surface of an object and the compact film of particles. The connector made in this way therefore becomes accessible on the opposite surface of the substrate, allowing it to assimilate to a vertical connector, through, generally called Through Silicon Via (TSV).

As stated hereinabove, irrespective of the embodiment in question, each connector is an electric, thermal, optical, piezoelectric or mechanical connector, with several of these functions of course able to be combined.

Preferably, at least one connector matches an upper surface of at least one of the objects.

Alternatively or simultaneously, a connector matches a lower surface of at least one of the objects by being interposed between this lower surface and the compact film of particles.

Preferably, said substance is in the form of liquid or paste.

Preferably, said substance has a hydrophobicity, and preferably also in the polymerised solid state of the connector. More generally, given especially those cases where the carrier liquid is not water, it is noted that the substance comprising the polymerisable compound proves to be non-miscible with the carrier liquid.

Preferably, said substance is based on silicone resin, epoxy resin, and/or polyurethane resin.

Preferably, to give the connector its primary function in particular to make it electrically conductive and/or thermally conductive, said substance comprises at least some particles taken from the following materials:
 carbon black;
 carbon nanotubes;
 graphene;
 fibers, such as carbon, steel, aluminium, copper fibers;
 metal powders; and
 metal oxides.

In addition, it is recalled that before or after the connector is made, the object(s) are placed then held by the compact film of particles floating on the carrier liquid of the transfer area, within which said objects are displaced with said film of particles so as to be transferred onto the substrate when they reach the outlet.

The concept is here based on the use of a compact film of particles to keep the objects on the carrier liquid, in position then to convey these same objects onto the substrate. The transfer of objects may consequently be carried out with precision on the substrate, simply, reliably, and repetitively. Also, since objects fitted with connectors are not deposited directly on the substrate, it is easily possible to readjust their position in the transfer area, before they are deposited on this same substrate.

The compact film of particles is therefore tantamount to a platform for hosting objects which are homogeneous or heterogeneous, nanoscopic, microscopic, millimetric or macroscopic. This platform itself may be composed of a homogeneous or heterogeneous set of nanometric or microscopic particles, preferably of compositions different to those of the objects to be transferred. As will be detailed hereinbelow, the objects to be transferred may be integrated into this platform, or simply be arranged on the latter.

In fact, according to a first possibility, at least one of the objects to be transferred is placed in the transfer area, floating on the carrier liquid forming a conveyor, so as to be enclosed by the compact film of particles. Here, the objects are held in position by the particles which enclose them at their periphery. The objects present a lower surface directly in contact with the carrier liquid.

According to a second possibility, at least one of the objects to be transferred is placed in the transfer area on the compact film of particles previously formed so as to create in the carrier liquid depression of particles which support it.

In this second solution, the depressed particles located below each object define a level break with the surrounding particles of the film. These are these same surrounding particles which enclose the periphery of each object, in this way keeping them in position and transporting them as for that of the first solution.

Of course, objects may be placed in the film of particles according to the first solution and others according to the second solution, without departing from the scope of the invention.

Also, as mentioned hereinabove, the compact film of particles may be formed from heterogeneous particles. These particles may also be functionalised at their surface so that a physical link forms between particles, for example of polymer type, to reinforce cohesion and therefore the lift of the compact film.

Preferably, the ratio between the large dimension of particles of the compact film and that of the objects to be transferred is between $10^4$ and $10^8$. By way of example, the particles forming the compact film may have a large dimension of the order of 1 nm to 500 μm, whereas the objects conveyed by this film may as such have a large dimension ranging up to about 30 cm.

Preferably, the particles of the compact film are silica beads of around 1 μm in diameter. It is noted however that the film may be heterogeneous, specifically comprise beads of different sizes.

Preferably, each object to be transferred has a large dimension greater than 0.2 cm, and preferably less than 30 cm. This last value may be adapted as a function of the width of the transfer area. In fact, the large dimension of each object may reach a value close to the above width. Objects of micrometric or nanometric size may also be deposited/transferred departing from the scope of the invention.

Preferably, each object to be transferred has at least one part of hydrophobicity. This is provided to ensure floating of the object, by placing this part in contact with the carrier liquid. This contact face with the liquid may be totally hydrophobic or comprise an arrangement of hydrophilic and hydrophobic areas, useful for the final device.

The object to be transferred may have any form, not necessarily plannar, optionally having one or more radii of curvature, for example less than 5 cm, or even integrating pins useful for connection. Similarly, for the particles of the film, the shapes may be varied.

By way of indicative examples, each object to be transferred may be an element taken from the group of silicon chips, micro-battery cells, components of organic electronics, photovoltaic components, LED, PLED, OLED, metallic elements, battery cells and micro-battery cells.

Another aim is the manufacture of complex devices such as for example sensors comprising detection elements (particles, for example), one or more energy-recovery systems (photovoltaic cell, piezoelectric film, fuel cell), an energy-storage system (micro-battery), an information management system (silicon chip), a communications system (RFID chip), electric connection elements (conductive tracks), electronic components (resistors, capacitors), weld elements (preforms). The objects necessary for providing these devices are arranged consequently on the liquid conveyor, and are superposed as needed.

It is also noted that the compact film of particles, whereof the concept is for example disclosed in the document Sachin Kinge, "*Self-Assembling Nanoparticles at Surfaces and Interfaces*", ChemPhysChem 2008, 9, 20-42, may be obtained at the surface of the carrier liquid by any technique known to one skilled in the art, for example by compression (Langmuir-Blodgett), and/or dipole-dipole interaction, and/or by magnetic field, etc.

The dipole-dipole interaction technique is applied for particles with facets, for example tetrahedral, cubic or further octahedral particles. With these shapes, the dipole-dipole interactions play an important role in the organization of the particles. The dipolar moments are generated inside these particles, because of the difference in polarity between the facets.

The magnetic field organization technique is used with magnetic nanoparticles which may be ordered by using an intense magnetic field, generating strong interactions between the particles.

The compression technique is notably known from the document Lucio Isa et al., "Particle Lithography from Colloidal Self-Assembly at Liquid_Liquid Interfaces", ACS Nano, Vol. 4 ■ No. 10 ■ 5665-5670 ■ 2010, from the document Markus Retsch, 'Fabrication of Large-Area, Transferable Colloidal Monolayers Utilizing Self-Assembly at the Air/Water Interface", Macromol. Chem. Phys. 2009, 210, 230-241, or further from document Maria Bardosova, "The Langmuir-Blodgett Approach to Making Colloidal Photonic Crystals from Silica Spheres", Adv. Mater. 2010, 22, 3104-3124.

This compression technique also comprises the tilted ramp solution described in document CA 2,695,449. Thus, the method according to the invention preferentially applies a tilted ramp for circulation of the particles, attached to an inlet of the transfer area, and on which said carrier liquid is also intended to circulate.

Some of the energy necessary for ordering particles in normal embodiment is directed here via the tilted ramp transporting the carrier liquid and the particles. Other solutions are however possible, such as setting in motion by means of a pump of the carrier liquid on a horizontal plane whereof the downstream part constitutes the particle transfer area. Another solution consists of replacing the pump by a wind tunnel for applying airflow to the surface of the carrier liquid, on which the particles and the objects to be transferred float. As mentioned hereinabove, other solutions are feasible departing from the scope of the invention, such as particle compression work via a technique called <<Langmuir-Blodgett>>.

Finally, following transfer of particles and objects onto the substrate, the method preferably integrates a thermal annealing step for easier deposit and adherence of these particles and objects onto the substrate.

Other advantages and characteristics of the invention will emerge from the following detailed non-limiting description.

BRIEF DESCRIPTION OF THE DRAWINGS

This description will be given with respect to the appended drawings, wherein.

DETAILED DESCRIPTION OF PREFERRED EMBODIMENTS

Figure 1:
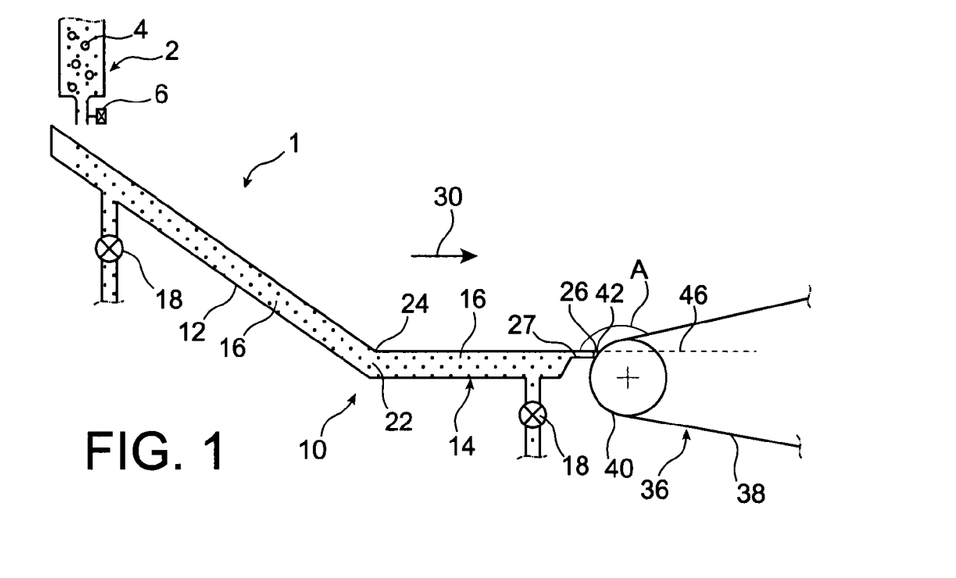
FIG. 1 shows a transfer facility according to a preferred embodiment of the present invention, in schematic section taken along line I-I of FIG. 2.
Figure 2:
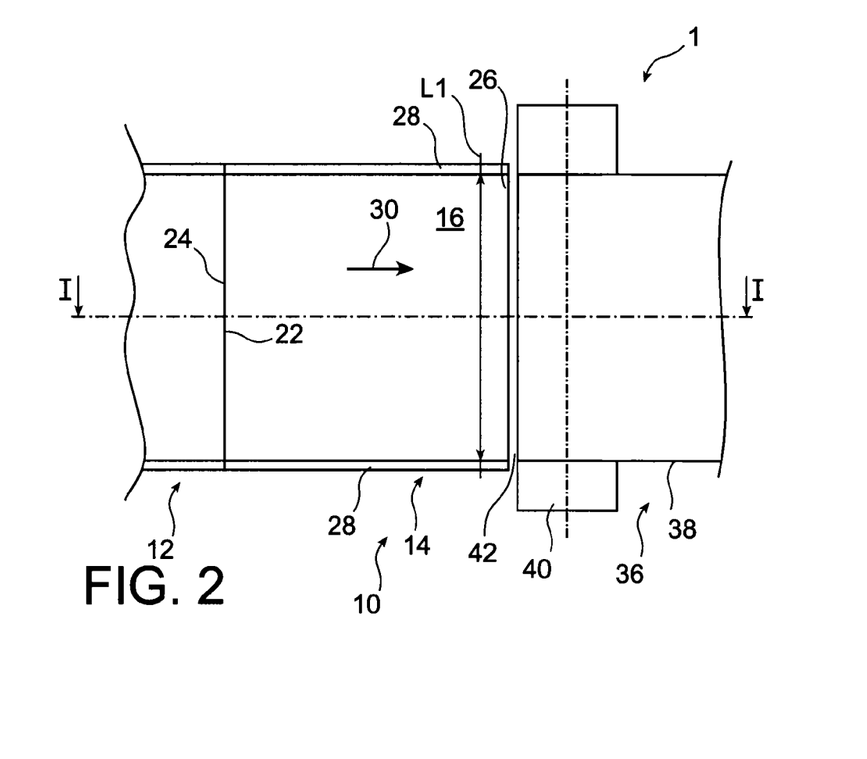
FIG. 2 illustrates a schematic plan view of the transfer facility shown in FIG. 1.

In reference first to FIGS. 1 and 2, these show an facility 1 for the transfer of objects to a substrate, preferably running. This transfer, similar to a deposit, is done by means of a compact film of particles.

The facility 1 comprises a device 2 for dispensing particles 4, whereof the size may be between a few nanometres and several hundreds of micrometers. The particles, preferably of spherical form, may for example be particles of silica. Other particles of interest may be made of metal or metal oxide such as Platinum, TiO2, polymer such as polystyrene or PMMA, carbon, etc.

More precisely, in the preferred embodiment, the particles are spheres of silica of around 1 μm in diameter, stored in solution in the dispensing device 2. The proportion of the medium around 7 g of particles per 200 ml of solution, here butanol. Naturally, for the sake of clarity, the particles shown in the figures adopt a diameter greater than their real diameter.

The dispensing device 2 has a controllable injection nozzle 6, of around 500 μm in diameter.

The facility also includes a liquid conveyor 10, integrating a tilted ramp 12 for circulation of the particles, and a substantially horizontal transfer area 14, or even having a slightly tilt so as to promote emptying of the facility, if necessary. The high end of the tilted ramp is provided for receiving the injected particles from the dispensing device 2. This ramp is straight, tilted by an angle comprised between 5 and 60°, preferably between 10 and 30°, allowing the particles to be brought towards the transfer area 14. Further, a carrier liquid 16 circulates on this ramp 12, as far as in the transfer area. This liquid 16 may moreover be re-circulated by means of one or two pumps 18, between the transfer area 14 and the high end of the ramp. Preferably this is here de-ionized water, on which the particles 4 may float. Nevertheless, preference may be given to a new liquid via an open circulation circuit. This may also be an association of several non-miscible liquids.

The low end of this same ramp is attached to an inlet of the particle transfer area 14. This inlet 22 is at the level of an inflexion line 24 embodying the junction between the surface of the carrier liquid present on the inclined plane of the ramp 12, and the surface of the carrier liquid present on the horizontal part of the transfer area 14.

The particle inlet 22 is spaced from a particle outlet 26 by means of two side edges 28 holding the carrier liquid 16 in the area 14. These edges 28, opposite and at a distance from each other, extend parallel to a main direction of flow of the carrier liquid and the particles in the facility, this direction being shown by arrow 30 in FIGS. 1 and 2. The area 14 consequently takes the form of a corridor or a path open at its inlet and its outlet, even if other geometries could be adopted, departing from the scope of the invention.

The base of the downstream part of the transfer area has a plateau 27 slightly inclined upwards relative to the horizontal direction, for example of a value of the order of 5 to 10°. It is the downstream end of this same plateau 27, also called <<blade>>, which in part defines the particle outlet 26.

The facility 1 is also provided with a substrate conveyor 36, intended to set the substrate 38 running. This substrate may be rigid or supple. In this latter case, it may be set in motion on a roller 40 whereof the axis is parallel to the outlet 26 of the area 14, near which it is located. In fact, the substrate 38 is intended to scroll very closely to the outlet 26, so that the particles reaching this outlet may then be easily transferred to this substrate, via a capillary bridge 42, also called a meniscus, which connects it to the carrier liquid 16. Alternatively, the substrate may be in contact directly with the transfer area, departing from the scope of the invention. The capillary bridge mentioned hereinabove is then no longer required.

In the example shown in the figures, the width of the substrate corresponds to the width of the area 14 and its outlet 26. This is a width L1 which corresponds also to the maximal width of the film of particles which may be deposited on the substrate. This width may be of the order of 25 to 30 cm. The width of the substrate on which the particles must be deposited may however be less than the width L1.

The capillary bridge 42 is ensured between the carrier liquid 16 which is at the level of the outlet 26, and part of the substrate 38 matching the guide/drive roller 40.

Preferably, the protruding angle A, formed between the horizontal direction 46 and the part of the substrate 38 on which the film of particles and the objects must be deposited, is greater than 160°, and even more preferably close to 180°, for example of the order of 175°.

A method for transferring objects will now be described in reference to FIGS. 3 to 7e.

First, the injection nozzle 6 is activated to commence dispensing of the particles 4 on the ramp 12. There is an initial step of filling the transfer area 14, by the particles 4, with the carrier liquid 16 already at the level required in the area 14.

Figure 3:
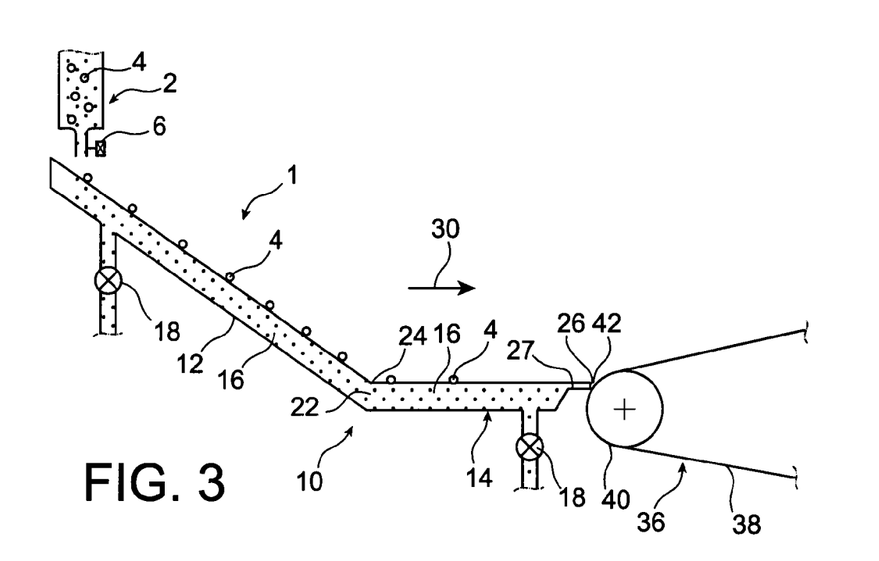
FIGS. 3 to 7 illustrate different steps of a transfer method executed by way of the facility shown in the preceding figures.
Figure 4:
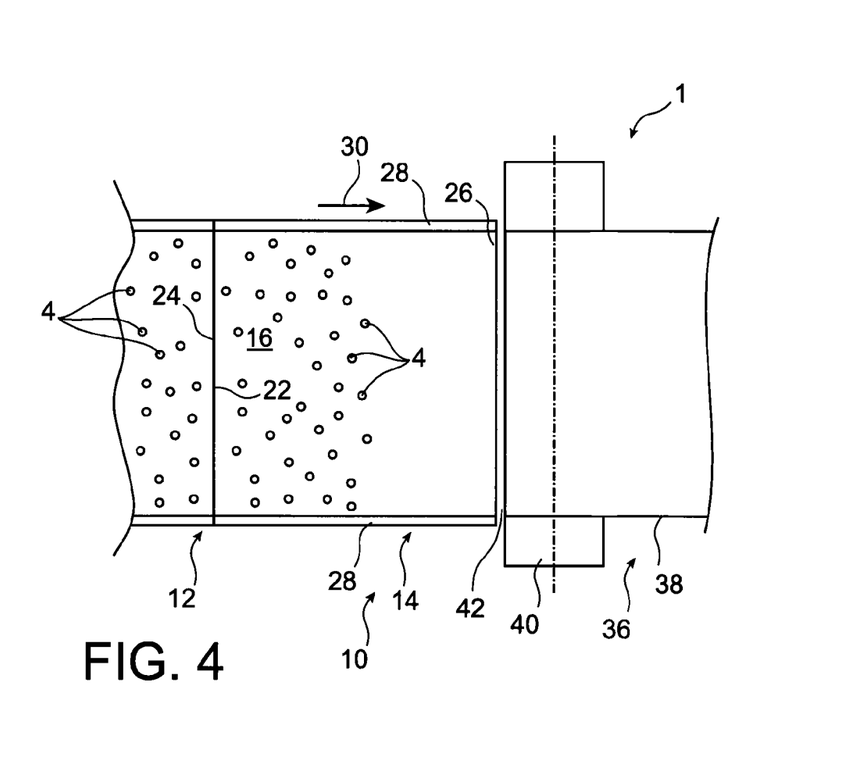

During this priming phase, the particles dispensed by the device 2 circulate on the ramp 12, then enter the area 14 wherein they are dispersed, as has been shown in FIGS. 3 and 4.

As the particles 4 are injected on the ramp and enter the transfer area 14, they are stopped against the substrate 38, then the upstream front of these particles tends to offset upstream, in the direction of the inflexion line 24. The injection of particles is continued even after this upstream front has exceeded the line 24 so that it returns to the tilted ramp 12.

Figure 5:
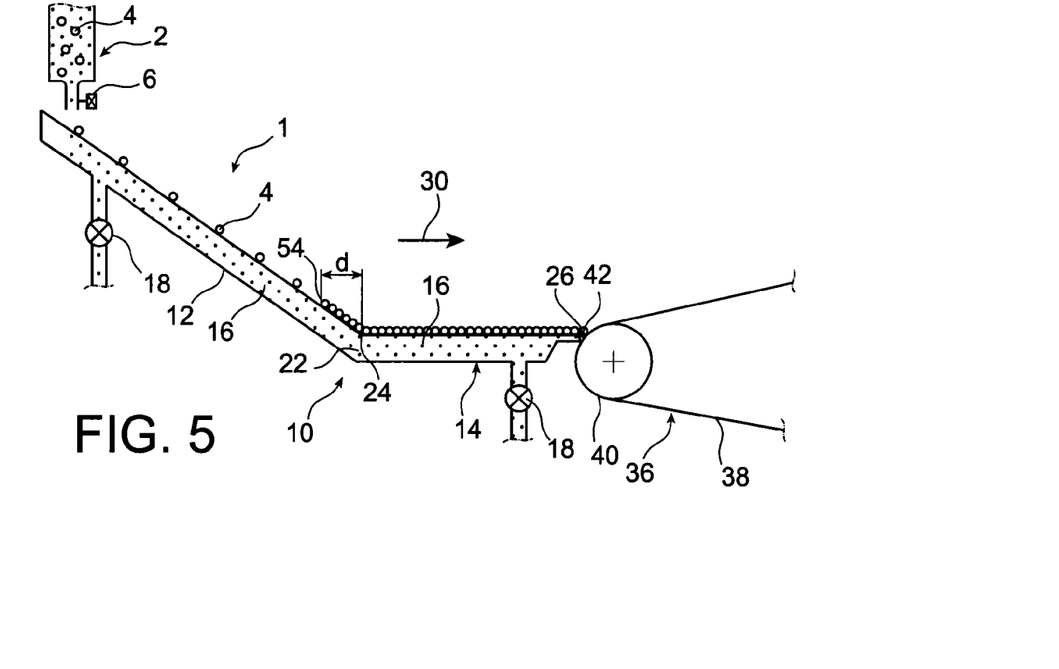

Effectively, it ensures that the upstream front of particles 54 returns to the ramp 12 so that it is at a given horizontal distance <<d>> from the inflexion line 24, as shown in FIG. 5. The distance <<d>> may be of the order of 30 mm.

At this instant, the particles 4 are ordered in the transfer area and on the ramp 12 where they are ordered automatically, without assistance, due especially to their kinetic energy and the capillary forces used at the time of impact on the front 54. The ordering is such that the resulting compact film has a structure called <<compact hexagonal>>, wherein each particle 4 is enclosed and contacted by six other particles 4 in contact with each other. This is either a compact film of particles or film of ordered particles.

Once the ordered particles 4 cover the entire carrier liquid located in the transfer area 14, the objects 50 to be deposited/transferred may be put in place above the film, at predetermined placements. This placing may be carried out by means of conventional handling or prehension tools adapted to the nature, form and dimension of the objects, such as pliers, according to a technique called <<pick and place>>. Other solutions are possible, such as that which will be described later in reference to FIGS. 11a to 11e.

Figure 6:
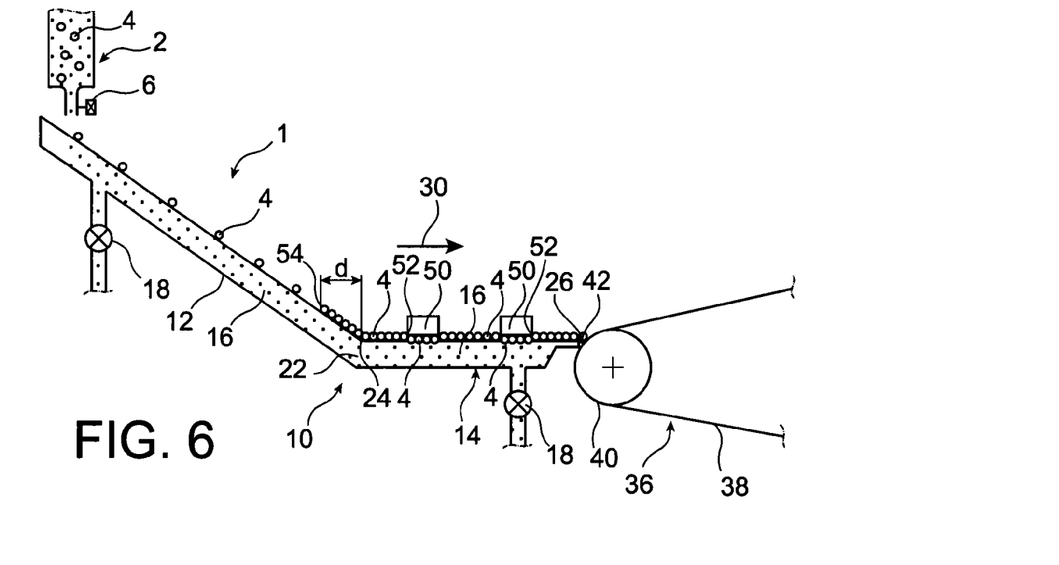

As shown in FIG. 6, the consequence of positioning the objects 50 on the film is to create a depression of the particles 4 which support these same objects, in the carrier liquid 16 forming a conveyor. It is noted that the objects may be kept at the surface of the liquid by the surface tension of this liquid, the film of particles modifying the surface tension of the liquid which may contribute to some degree to the performance of these objects.

More precisely, the depressed particles 4 located under each object 50 define a level break 52 with the other surrounding particles 4. It is these same surrounding particles which enclose the periphery of each object 50, keeping them in position relative to each other, as well as relative to the fixed structure of the transfer area.

Each level break 52 is preferably less than the diameter of the particles 4, such that the depressed particles 4 are also retained and held by the surrounding particles.

The positioning of the first objects, and the following, is done preferably without stopping the flow of particles coming from the ramp 12, even though it could be otherwise, departing from the scope of the invention.

Figure 7:
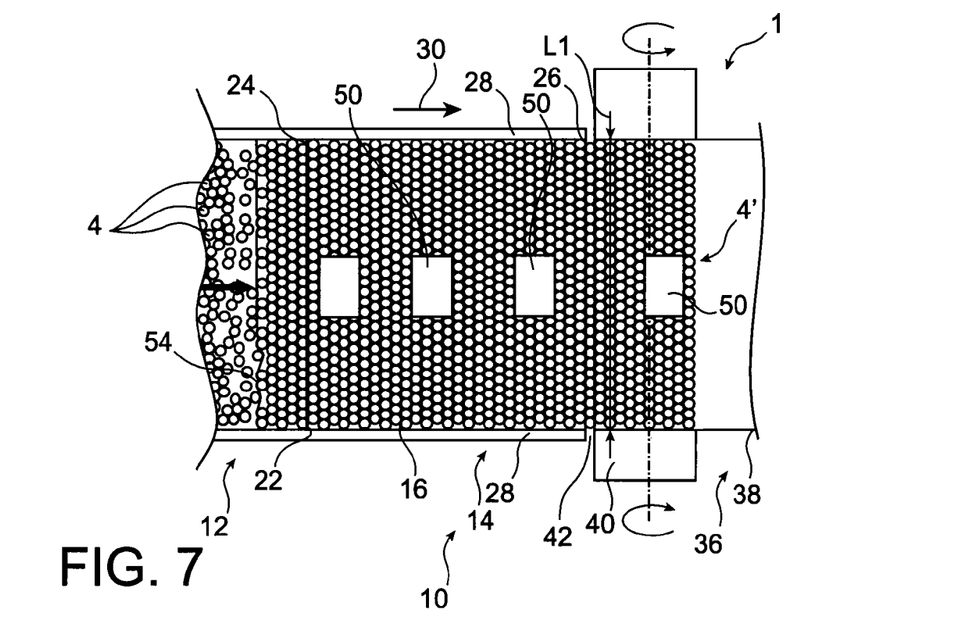
Figure 7A:
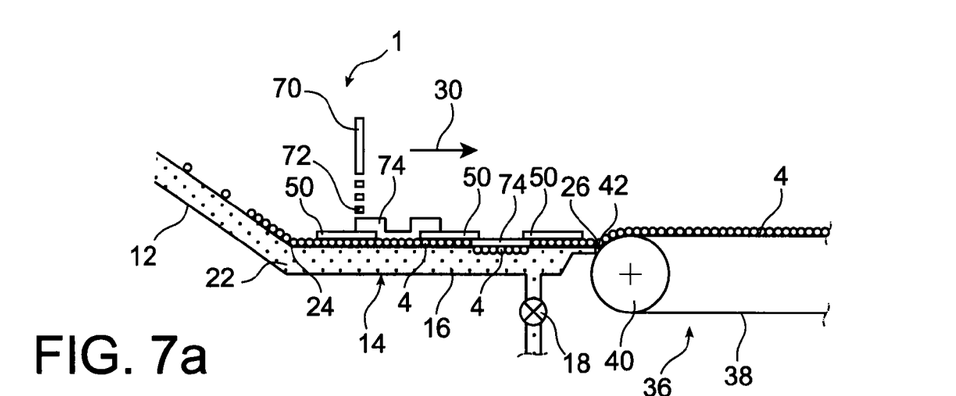
FIGS. 7a to 7e show steps for making different types of connectors on the objects to be transferred shown on the preceding figures.

FIG. 7 shows the status of facility after triggering of the movement of the substrate 38, initiated as soon as the front 54 has reached the required level shown in FIG. 5. The film of particles and the objects carried, held and conveyed by the latter are deposited onto the substrate 38 by borrowing the capillary bridge 42, in the way as for that described in document CA 2,695,449. Previously, as shown in FIGS. 7a and 7b, the method comprises a step for making one or more connectors on the objects 50.

For this to happen, a nozzle 70 for dispensing a substance 72, comprising a polymerisable compound, deposits this substance at the preferred site in the transfer area 14. In the embodiment shown in FIGS. 7a and 7b, it is provided that each resulting connector 74 connects two directly consecutive objects 50, set on the film 4 in the transfer area. In these figures, the left connector 74 connects the upper surface of a first object and the upper surface of a second object, matching the part of the film of particles 4 located between these two objects 50. As any polymerisable substance is capable of adapting to complex topography, with differences in levels, this substance proves perfectly adapted to the specified application wherein the objects 50 are likely to form levels with the film 4.

The right connector 74 as such connects the lower surface of the second object and the lower surface of a third object, matching also the part of the film of particles 4 located between these two objects 50. For this to happen, the substance is first deposited on the film of beads, prior to deposit of the objects to be connected, as opposed to the previous instance where it is the objects 50 which are previously put in place in the transfer area 14. So, the substance is arranged on the film of particles 4 between the latter and the lower surface of the relevant object 50.

Figure 7B:
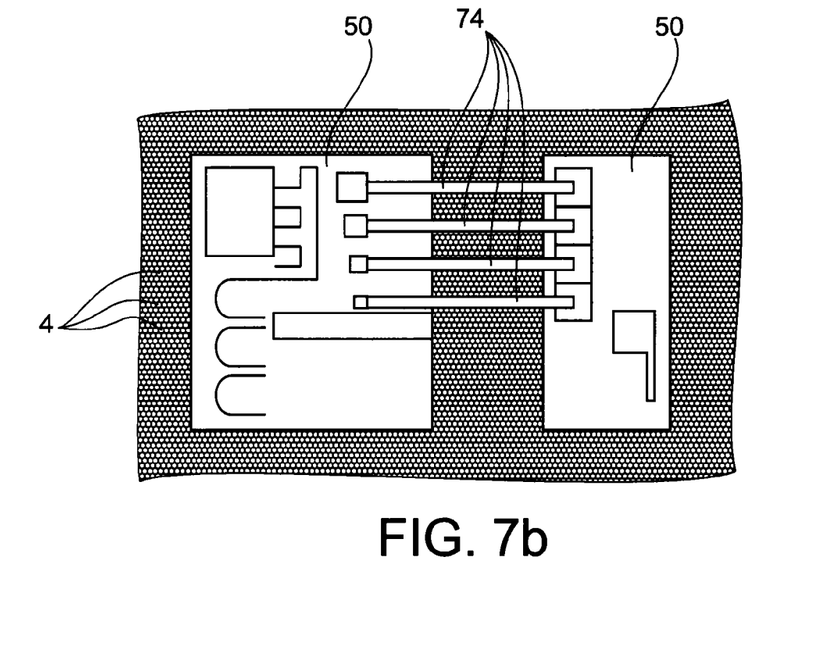

As is best seen in FIG. 7b, the connectors here take the form of continuous cords, but could alternatively be points.

The diameter of the cords is preferably between a few tens of microns and several millimetres.

The polymerisable compound is for example silicon resin, resin epoxy, and/or polyurethane resin. Polymerization is performed conventionally, for example thermally and/or optically, and is preferably done at least in part when the objects in contact with this substance are still in the transfer area, not yet deposited on the substrate.

The substance 72 is in liquid or paste form, to which particles may be added before being dispensed to functionalise the connectors, whereof the functions are electric, thermal, optical, piezoelectric and/or mechanical. By way of indicative examples, for electrical and/or thermal connectors added the particles may be carbon black, carbon nanotubes, graphene, fibers such as carbon, steel, aluminium, copper fibers, metal powders, metal oxides.

In addition, it is indicated that the substance is retained so that it permits some flexibility of the cord during transfer onto the substrate to support flexion during passage from the transfer area onto the substrate, and this because of the tilt A of the substrate relative to the horizontal direction. This flexibility therefore must subsist after partial or total polymerization of the cord in the transfer area, before transfer onto the substrate. This also is of interest when the substrate is supple.

Preferably, the substance 72 has a hydrophobicity in the liquid state, so that the latter remains at the surface of the carrier liquid after being dispensed on the film of particles 4, if the substance reaches this same surface of the carrier liquid. Irrespectively, after its deposit on the film the substance 72 adheres to the latter due to its composition. Also, the substance is also selected so as to remain insoluble in the carrier liquid in the liquid state, and also in the solid state after polymerization.

Figure 7C:
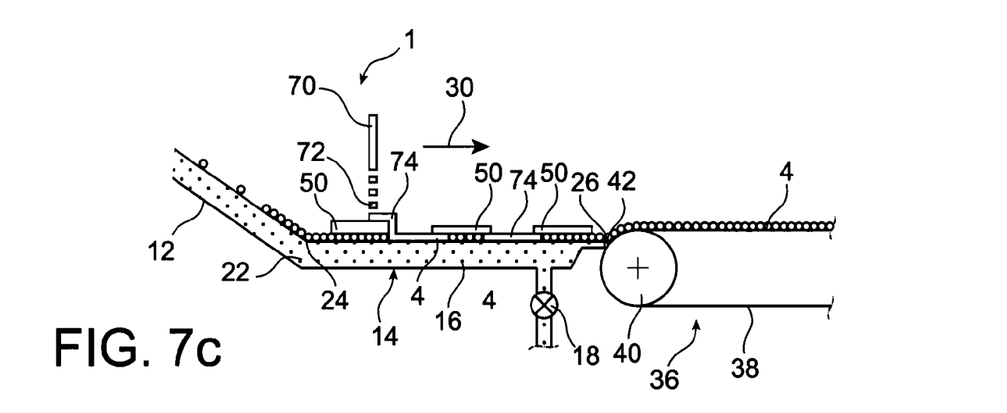

In FIG. 7c, the left connector 74 has the particular feature of connecting the upper surface of a first object 50, and the lower surface of a second object 50.

Figure 7D:
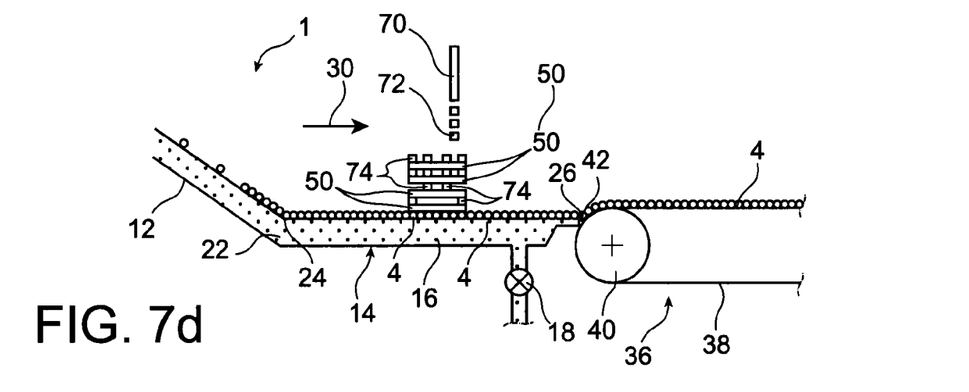

According to another possible realisation shown in FIG. 7d, the connectors 74 are deposited so as to connect two stacked objects 50. This enables construction of devices in three dimensions before transfer onto the substrate, due to the connectors connecting the lower surface of any object of the stack to the upper surface of the object located directly below in this same stack. The connectors 74 here fulfil at least one mechanical support function of the upper object.

Figure 7E:
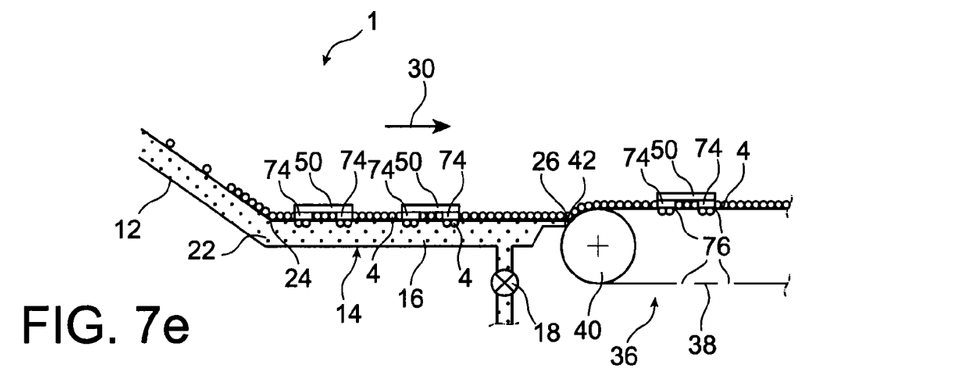

According to yet another embodiment shown in FIG. 7e, connectors 74 are made on the lower surface of objects 50 to be deposited, always by proceeding with deposit of the substance on the film of particles 4, prior to deposit of objects on the cords/points made with the substance 72. In addition, through-holes 76 are made onto the substrate 38. Deposit/drawing is then made such that the connectors 74 are housed automatically in the corresponding orifices 76 during transfer onto the substrate 38. After this transfer, the lower part of the connectors 74 is therefore accessible from the surface of the substrate opposite that on which the deposit has been made, this lower part 74 optionally continuing to carry particles 4 not awkward for connection.

As stated hereinabove, after deposit the width of this film 4' integrating the objects 50 corresponds to the width L1 of the outlet 26, even if a smaller width may be adopted, departing from the scope of the invention.

Even more preferably, the substrate is directly in contact with the outlet of the particles.

As the ordered particles 4 cover the entire surface of the carrier liquid 16 present in the transfer area, ordering is retained up to the time of depositing at the outlet 26 of the area 14. Retaining this ordering ensures that precise relative positioning between the objects 50 is kept, as well as a precise position relative to the fixed side edges 28, until these objects 50 fitted with their connectors 74 are deposited on/transferred onto the substrate with the particles 4.

For easier deposit and adherence of the particles 4 and objects 50 on the substrate, preferably made of polymer, thermal annealing following transfer is provided. This thermal annealing is for example done at 80° C., using a low-temperature matte laminating film based on polyester, for example sold under the reference PERFEX-MATT™, of a thickness 125 μm.

The advantage of such a film as substrate is that one of its faces becomes adhesive at a temperature of the order of 80° C., which facilitates adherence of the particles 4 and objects 50 on the latter. As this temperature is relatively low relative to working temperatures of objects specified by the invention as silicon chips or photovoltaic cells, fixing these objects may be done without deterioration.

More precisely, at this temperature, the particles 4 sink into the softened film 38 and enable direct contact of the objects with the film, resulting in their adhesion.

Alternatively, the substrate 38 may be of type silicon, glass, or piezoelectric film.

During transfer, the injection of particles and the running speed of the substrate are regulated such that the particle front remains in a substantially identical position. To do this, the rate of particles may be of the order of 0.1 ml/min to several ml/min, whereas the linear speed of the substrate 38, also called drawing speed, may be of the order of a few mm/min to several hundreds of mm/min. Of course, the objects 50 and the substance 72 are deposited on the film of ordered particles 4, in the transfer area 14, before the ensemble formed by these elements reaches the substrate 38 on which it is then deposited/transferred.

The objects to be transferred may be different sorts, as a function of the preferred applications. Preferably, each object 50 has a large dimension greater than 0.2 cm and less than or equal to L1, that is, close to 30 cm. The thickness is between ten micrometers and several tens of millimetres.

Some types of objects to be transferred such as solar cells, micro-battery cells and organic components have a simple form of a square, rectangle, even a disc, with minimal thickness, and a surface area of the order of 0.1 to 100 cm$^2$.

These components may comprise pins on the face in contact with the liquid to produce their connection. Other types of objects, for example the detection of elements, power generation or transport of information, may have complex shapes, for example curved or spiral parts.

In addition, the ratio between the large dimension of the particles 4 and that of the objects 50 to be transferred is preferably between $10^4$ and $10^8$. In fact, the large dimension of the particles is for example of the order of 1 nm to 500 μm, whereas the objects conveyed 50 may have a large dimension up to around 30 cm.

Preferably, the face of each object 50 in contact with the carrier liquid has a hydrophobicity, but it is also possible to provide an arrangement of hydrophilic and hydrophobic parts at this face. As stated hereinabove, the surface tension of the carrier liquid also plays an important role in the floating of these objects.

The table hereinbelow lists a few preferred examples for these objects 50.

| Nature | Dimensions | Field of application |
| --- | --- | --- |
| Polyethylene terephtalate (PET) with a structured gold layer at the surface | PET: 3 × 4 cm²; thickness 250 μm; PET: 1.5 × 0.9 cm²; thickness 250 μm, Au: thickness 30 nm | Organic electronics |
| Glass with a photovoltaic cell at the surface | 25 × 25 mm²; thickness 1.08 mm | Photovoltaic cell |
| Silicon chip | 3 × 3 cm²; thickness 500 μm 1 × 1 cm²; thickness 500 μm | Electronics |
| Micro-battery on silicon | 1 × 1 cm²; thickness 500 μm | Energy storage |
| Bi-metal blade metal material (eg.: zinc/copper) | 3.5 × 2 cm²; thickness 140 μm 5 × 1.6 cm²; thickness 200 μm 7 × 1.6 cm²; thickness 200 μm | Heat, sensors |

Figure 8:
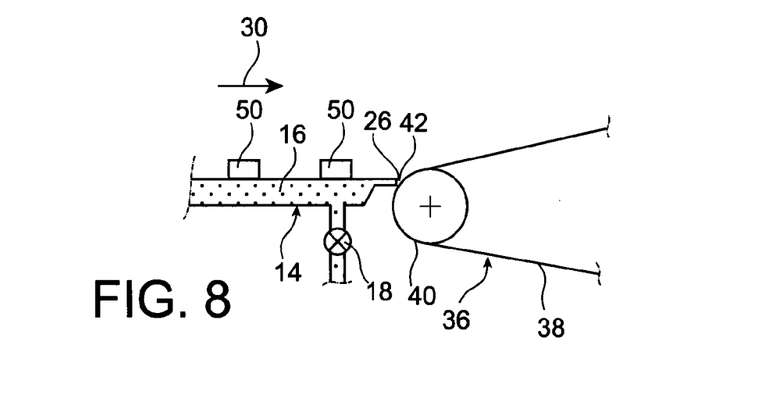
FIGS. 8 and 9 illustrate different steps of another transfer method, also executed by means of the facility shown in FIGS. 1 and 2.
Figure 9:
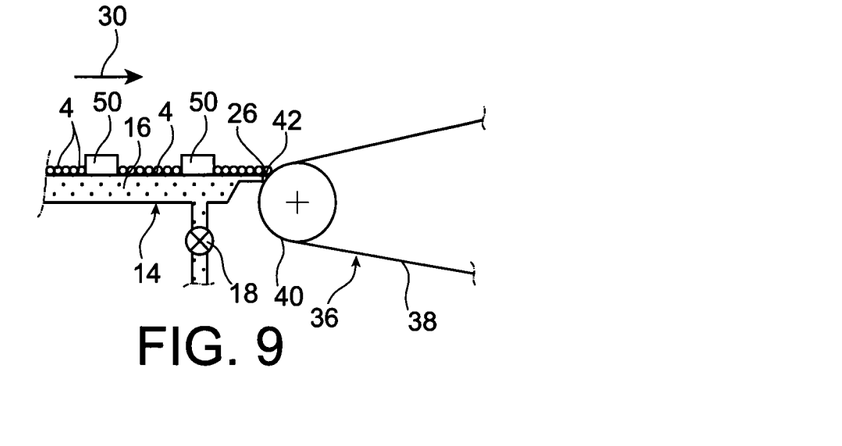

In reference now to FIGS. 8 and 9, these show steps of a method for transferring objects according to another embodiment.

This method differs from the preceding because the objects 50 are not placed on the film of ordered particles 4, but float on the carrier liquid 16 and are enclosed by this same film. Here, the objects 50 are preferably placed on the carrier liquid before formation of the compact film of particles, which is then formed around these objects so as to keep them in position by enclosing them at their periphery. The objects have a lower surface directly in contact with the carrier liquid. In this embodiment, it is also the film of ordered particles which keeps the objects in position and transports them in order onto the substrate on which the latter must be deposited.

Figure 9A:
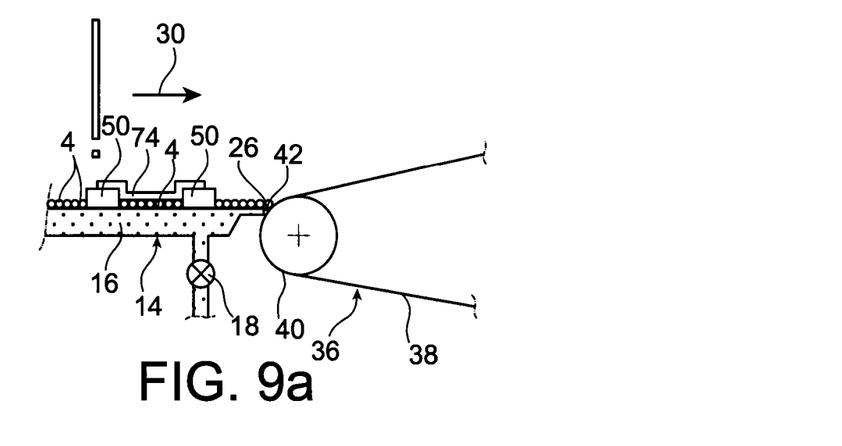
FIG. 9a shows a step for making a connector between two objects to be transferred shown in FIG. 9.

The other steps of the method are similar to those described for the preceding method, in particular that relative to formation of the connectors 74 shown in FIG. 9a.

Figure 10:
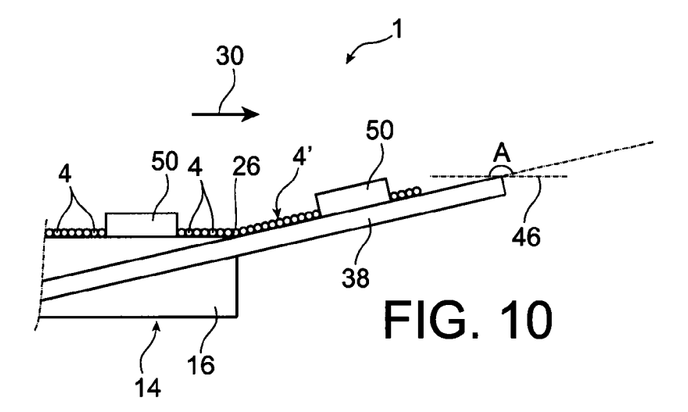
FIG. 10 illustrates a transfer facility according to another preferred embodiment of the present invention.

Finally, FIG. 10 illustrates another facility 1 for transfer of an object, which differs from the preceding essentially because the running substrate 38 is rigid. In this figure, the elements bearing references identical to those on elements of the preceding figures correspond to identical or similar elements.

As stated hereinabove, several solutions are possible for deposit of the objects 50. Among preferred solutions, there is that consisting of providing one or more conveyors for transport of these objects to the transfer area. Naturally, even though this has not been shown, these techniques are provided in addition to that for deposit of the substance to produce different connectors on the objects 50.

Figure 11A:
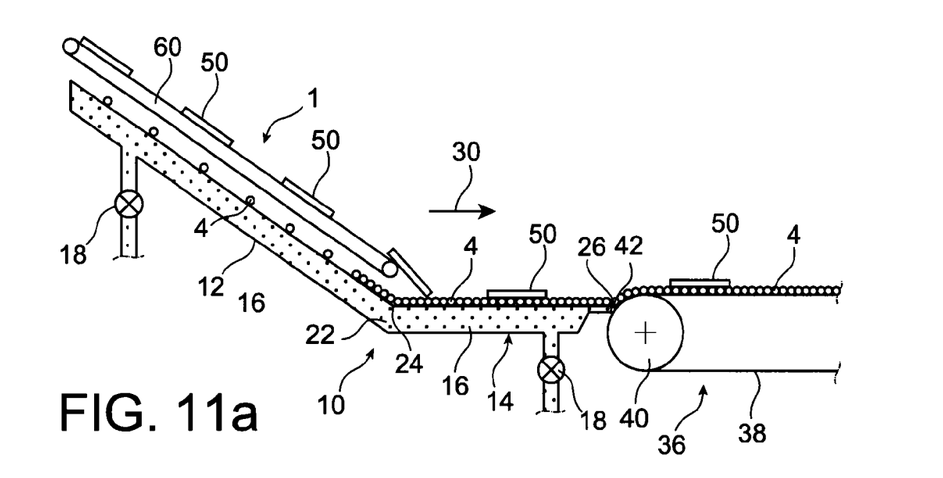
FIGS. 11a to 11e show different solutions for placing objects in the transfer area.

Each conveyor 60 is preferably parallel to the ramp 12, as shown in FIG. 11a. The conveyor 60, fixed or mobile, may be made in any way deemed appropriate by one skilled in the art, typically by means of a ribbon or a succession of rollers. The objects are transported and deposited by the conveyor 60 at a rate determined as a function of the preferred arrangement of these objects relative to the film of particles 4.

Figure 11B:
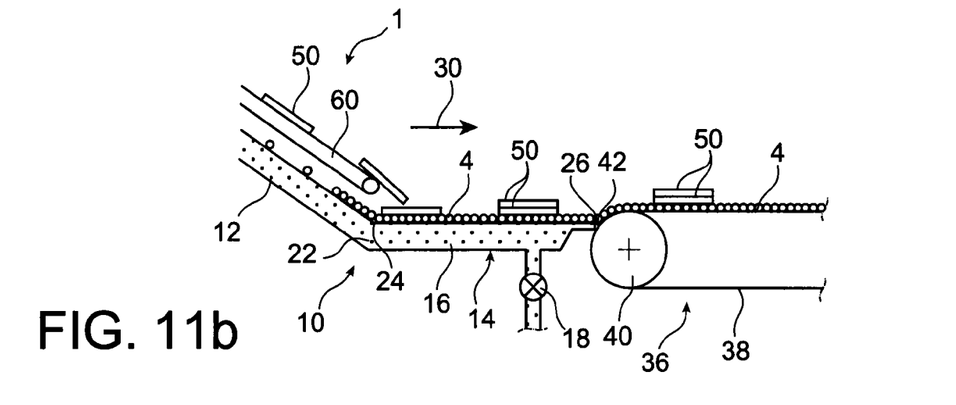
Figure 11C:
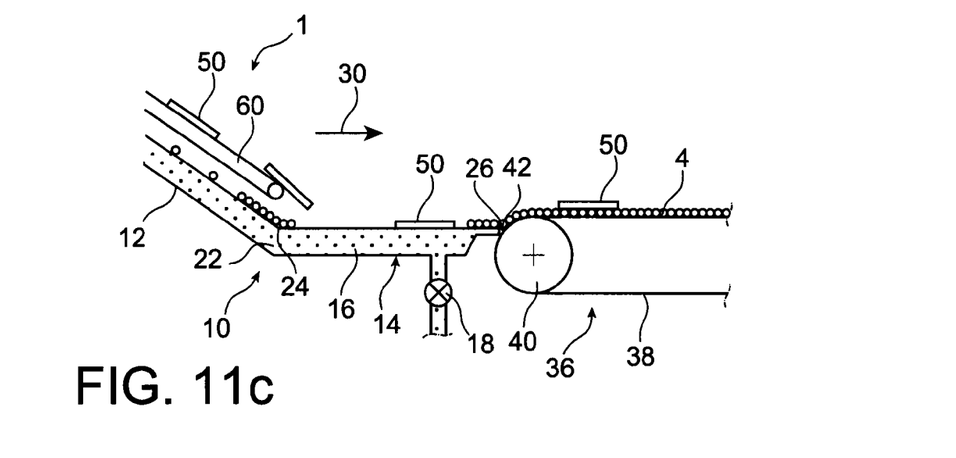
Figure 11D:
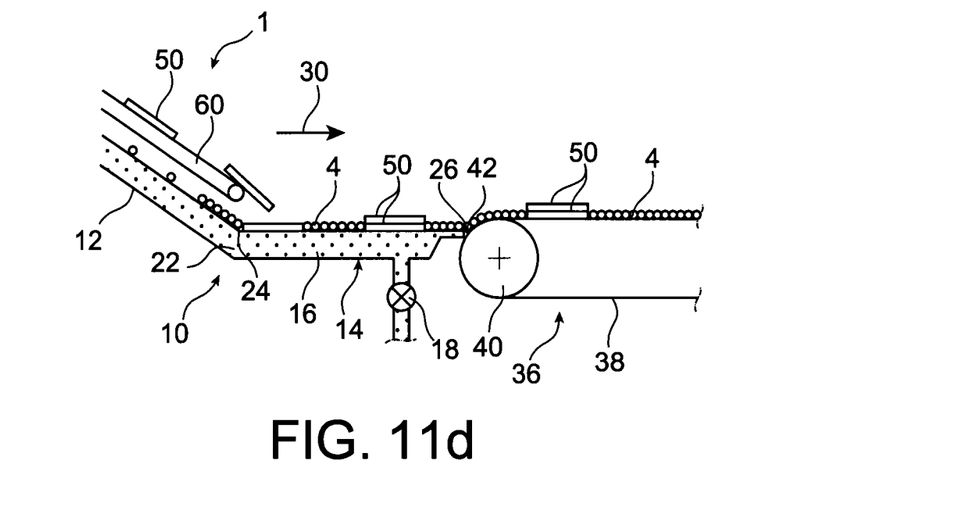

Also, with this technique, it is not only possible to deposit the objects 50 on the film of particles 4 as shown in FIG. 11a, but also directly on the carrier liquid 16 before the particles 4 enclose it in the transfer area 14, as shown in FIG. 11c. Alternatively, it is also possible to deposit the objects 50 on other similar objects, as shown in FIGS. 11b and 11d. In FIG. 11b, the objects 50 are deposited onto other objects 50 in turn placed on the film of particles, whereas in the example of FIG. 11d, the objects 50 are deposited on other objects 50 already integrated into the film of particles 4.

Figure 11E:
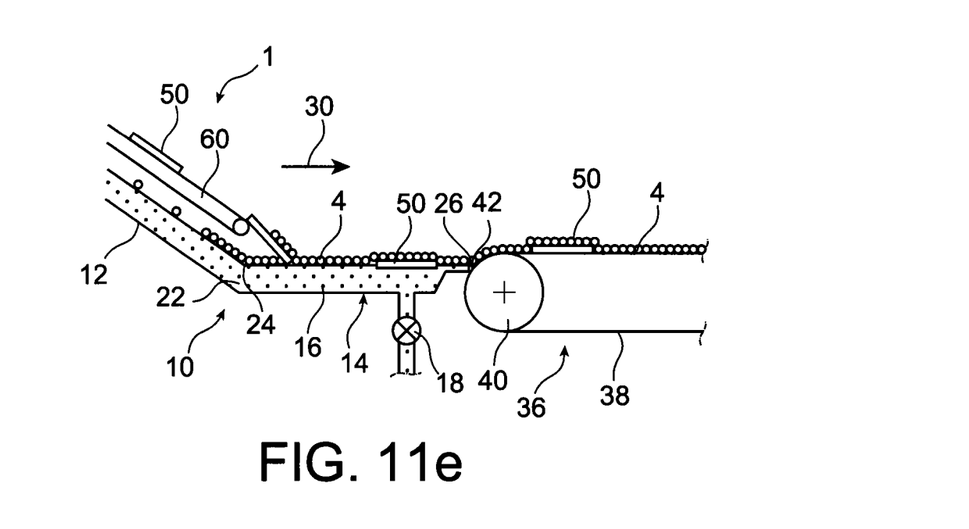

Finally, of these solutions for depositing objects called <<unwound>>, it is possible to ensure that the objects 50 escape from the conveyor 60 and perforate the film so as to slide under the latter, as shown in FIG. 11e. After stabilisation, each object 50 floating on the carrier liquid 16 is firmly held by the particles 4 of the film which encloses them.

Attached to the conveyor 60, a vision module (not shown) with image-processing software may track in real time the shift of objects on the conveyor 60, the transfer of these elements, and finally drawing of the whole on the substrate. This vision module may also calculate the geometric distances between the objects deposited on the compact film, and optimally compare these distances to a theoretical pre-programmed diagram so as to validate proper positioning of the deposited objects.

Of course, various modifications may be made by one skilled in the art to the invention which has just been described, solely by way of non-limiting examples.

The invention claimed is:

1. A method for transferring objects onto a substrate, comprising:
    providing a transfer area including a carrier liquid forming a conveyor;
    providing a film of particles floating on the carrier liquid;
    placing the objects on the film of particles, the objects displacing a portion of the film of particles;
    forming at least one connector between at least two consecutive objects of the objects placed on the film of particles, the at least one connector being in contact with at least one of said two consecutive objects and comprising a substance including a polymerisable compound, the forming comprising polymerising the substance; and
    conveying the objects on the transfer area, the displaced portion of the film of particles keeping the objects on the carrier liquid during the conveying.

2. The method according to claim 1, wherein the forming the at least one connector further comprises applying the substance including the polymerisable compound to the film of particles to connect the at least two consecutive objects spaced apart from each other within the transfer area, and then polymerising the substance.

3. The method according to claim 1, wherein the forming the at least one connector further comprises applying the substance including the polymerisable compound to one of the at least two consecutive objects to connect the at least two consecutive objects to be stacked on each other within the transfer area, and then polymerising the substance.

4. The method according to claim 1, wherein the substrate includes at least one through-hole housing the at least one connector formed between a lower surface of an object of the at least two consecutive objects and the film of particles.

5. The method according to claim 1, wherein the at least one connector is an electric, thermal, optical, piezoelectric, or mechanical connector.

6. The method according to claim 1, wherein the at least one connector is disposed on an upper surface of at least one of the at least two consecutive objects.

7. The method according to claim 1, wherein the at least one connector is disposed on a lower surface of at least one of the objects by being interposed between the lower surface and the film of particles.

8. The method according to claim 1, wherein the substance is in a form of a liquid or a paste.

9. The method according to claim 1, wherein the substance is hydrophobic.

10. The method according to claim 1, wherein the substance is based on a silicone resin, an epoxy resin, and/or a polyurethane resin.

11. The method according to claim 1, wherein the substance comprises at least some particles taken from following materials: carbon black; carbon nanotubes; graphene; fibers, including at least one of carbon, steel, aluminium, or copper fibers; metal powders; and metal oxides.

12. The method according to claim 1, wherein at least one of the at least two consecutive objects is placed in the transfer area, floats on the carrier liquid forming the conveyor, and is enclosed by the film of particles.

13. The method according to claim 1, wherein at least one of the at least two consecutive objects is placed in the transfer area on the film of particles and depresses into the carrier liquid particles in the film of particles underlying said at least one of the at least two consecutive objects.

14. The method according to claim 1, wherein the placed objects each have a large dimension greater than 0.2 cm.

15. The method according to claim 1, wherein the placed objects are objects taken from the group of silicon chips, components of organic electronics, metallic elements, photovoltaic cells, battery cells, and micro-battery cells.

16. The method according to claim 1, further comprising circulating particles of the film of particles and the carrier liquid by a tilted ramp attached to an inlet of the transfer area.

* * * * *